(12) United States Patent
Cassaigne et al.

(10) Patent No.: US 10,168,206 B2
(45) Date of Patent: Jan. 1, 2019

(54) COOLING DEVICE COMPRISING AN IMPROVED COLD FINGER

(71) Applicants: SOCIÉTÉ FRANÇAISE DE DÉTECTEURS INFRAROUGES—SOFRADIR, Palaiseau (FR); UNIVERSITÉ GRENOBLE ALPES, Saint-Martin-d'Hères (FR)

(72) Inventors: Pierre Cassaigne, Grenoble (FR); Alexis Lenain, Grenoble (FR); Sébastien Gravier, Saint Martin d'Hères (FR)

(73) Assignees: SOCIÉTÉ FRANÇAISE DE DÉTECTEURS INFRAROUGES—SOFRADIR, Palaiseau (FR); UNIVERSITÉ GRENOBLE ALPES, Saint-Martin-d'Hères (FR)

( * ) Notice: Subject to any disclaimer, the term of this patent is extended or adjusted under 35 U.S.C. 154(b) by 145 days.

(21) Appl. No.: 15/412,389

(22) Filed: Jan. 23, 2017

(65) Prior Publication Data

US 2017/0205281 A1    Jul. 20, 2017

(30) Foreign Application Priority Data

Jan. 20, 2016    (FR) ...................................... 16 50457

(51) Int. Cl.
*H01L 31/024*    (2014.01)
*G01J 1/42*    (2006.01)
*C22C 30/02*    (2006.01)
*C22C 45/10*    (2006.01)
*G01J 1/02*    (2006.01)
(Continued)

(52) U.S. Cl.
CPC ................. *G01J 1/42* (2013.01); *C22C 30/02* (2013.01); *C22C 45/10* (2013.01); *F25D 19/006* (2013.01); *G01J 1/0252* (2013.01); *G01J 5/04* (2013.01); *G01J 5/061* (2013.01); *H01L 31/024* (2013.01); *H01L 31/1032* (2013.01); *H01L 31/1035* (2013.01)

(58) Field of Classification Search
CPC ............. H01L 31/1035; H01L 31/1032; H01L 31/024; G01J 5/061; G01J 1/0252; F25D 19/006; C22C 30/02
See application file for complete search history.

(56) References Cited

U.S. PATENT DOCUMENTS 5,032,196 A     7/1991   Masumoto et al.
5,198,671 A *   3/1993   Hatch ................... F25D 19/006
                                                      250/352

(Continued)

OTHER PUBLICATIONS

Hongwen Zhang et al; "Mechanical behavior of bulk (ZrHf)TiCuNiAl amorphous alloys;" Scripta Materialia; 2003; vol. 49; pp. 447-452.

*Primary Examiner* — Tony Ko
(74) *Attorney, Agent, or Firm* — Oliff PLC (57) ABSTRACT

The detection device comprises a cold finger which performs thermal connection between a detector fitted on a cooling plate and a cooling system. The cold finger comprises at least one side wall at least partially formed by an area made from the hafnium-based amorphous metal alloy. Advantageously, the whole of the cold finger is made from the hafnium-based amorphous metal alloy.

15 Claims, 3 Drawing Sheets

(51) Int. Cl.
*F25D 19/00* (2006.01)
*G01J 5/04* (2006.01)
*G01J 5/06* (2006.01)
*H01L 31/103* (2006.01)

(56) References Cited

U.S. PATENT DOCUMENTS

| | | |
|---|---|---|
| 7,645,350 B1 | 1/2010 | Kecskes et al. |
| 8,163,109 B1 | 4/2012 | Kecskes et al. |
| 2012/0017607 A1* | 1/2012 | Bin-Nun .................. F25B 9/14 62/6 |
| 2012/0056234 A1* | 3/2012 | Lee ........................ B23K 35/26 257/99 |
| 2015/0021477 A1 | 1/2015 | Cassaigne |

\* cited by examiner

COOLING DEVICE COMPRISING AN IMPROVED COLD FINGER

BACKGROUND OF THE INVENTION

The invention relates to a cooling device comprising a cold finger closed by a cooling plate.

STATE OF THE ART

In the field of detection devices, there is generally a photodetector associated with a read circuit. The photodetector delivers a signal representative of the observed scene and this signal is processed by the read circuit.

Polarization of the photodetector is obtained by means of a substrate potential imposed on a first terminal of the photodetector and by means of a reference potential imposed on the second terminal of the photodetector. The reference potential is imposed by a read device of capacitive transimpedance amplifier type.

In order to obtain good detection performances, it is advantageous to use particular substrates, for example made from a Mercury, Cadmium, Tellurium base, and to make this equipment operate at low temperature. The use of a low temperature enables parasite electric disturbances to be limited when transformation of the optic signal into an electric signal is performed.

In conventional manner, the detection circuit is thermally associated with a cooling device which performs heat removal.

Such a device mainly comprises a hollow part of elongate shape, preferentially cylindrical in revolution, which is called "cold finger". The cold finger enables thermal connection between the detection device which is to be cooled and the cooling system, for example a cryogenerator which enables the detection device to be cooled to its operating temperature and to be kept at this temperature, ensuring a maximum thermal insulation between the top part which is at low temperature and the bottom part which is hotter.

In conventional manner, it is advantageous to provide a cold finger which presents walls that are as thin as possible. The reduction of the dimensions of the cold finger and in particular of the thickness of the walls enables the thermal conductance of the cold finger to be reduced. For example, for a finger having a height of 50 mm and an external diameter of 6 to 10 mm, the walls have a thickness of 0.1 mm. The cold fingers are generally made from titanium alloy TA6V which presents the necessary mechanical performances for satisfactory operation of the cold finger as well as acceptable thermal performances.

The use of thin walls prevents a too large cooling energy expenditure from the cooling system by reducing thermal leaks. The use of thin walls enables thermal leaks to be reduced by increasing the thermal resistance linked to the walls. The loss of cooling energy delivered by the cooling system to other elements than the detection device is thus minimized. The operating temperature is thus maintained more easily, with a superfluous cooling energy expenditure that is as low as possible. Reduction of the thickness of the walls thereby enables the efficiency to be enhanced.

This architecture is however difficult to implement and the final performances of the device are not satisfactory.

It has been observed that if the walls of the cold finger are too thin, they are not sufficiently rigid to prevent deformation of the cold finger during operation of the latter. This deformation of the cold finger results in a considerable loss of the optical performances of the detection device in particular on account of the vibrations linked to the cooling system.

In addition to the thermal stresses on the cold finger, it is also necessary to take into consideration mechanical stresses which occur due to the vibration of the top part of the cold finger which comprises a cooling plate with the element to be cooled.

The TA6V alloy is advantageous as it presents good mechanical performances to counteract the vibration phenomena. The performances of the alloy against vibration phenomena are represented by the ratio between the Young's modulus and the volumetric mass density.

The same problems exist in general manner on all cooling devices using a cold finger and more particularly for cryostats as the latter have to cool a specific element.

Object of the Invention

It is observed that a requirement exists to provide a cooling device that presents enhanced thermal performances while at the same time preserving a simple and robust execution and the necessary mechanical performances. One of the objects of the invention is to propose a cryostat in which heat losses are reduced to the minimum.

This object tends to be achieved by means of a cooling device which comprises
 a cooling plate,
 a cooling system provided with a cooling fluid,
 a hollow cold finger closed at one end by the cooling plate, the cooling fluid being located in the cold finger to cool the cooling plate, the cold finger comprising at least one side wall defining a confinement channel of the cooling fluid from the cooling system.

The device is remarkable in that:
 said at least one side wall is at least partially formed by an area made from at least partially amorphous metal alloy,
 the area made from at least partially amorphous metal alloy is formed by an at least ternary alloy containing at least 17.5% in atomic % of hafnium and possibly of copper with a maximum content equal to 40% in atomic % of copper so as to form a thermal insulator.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

Figure 1:
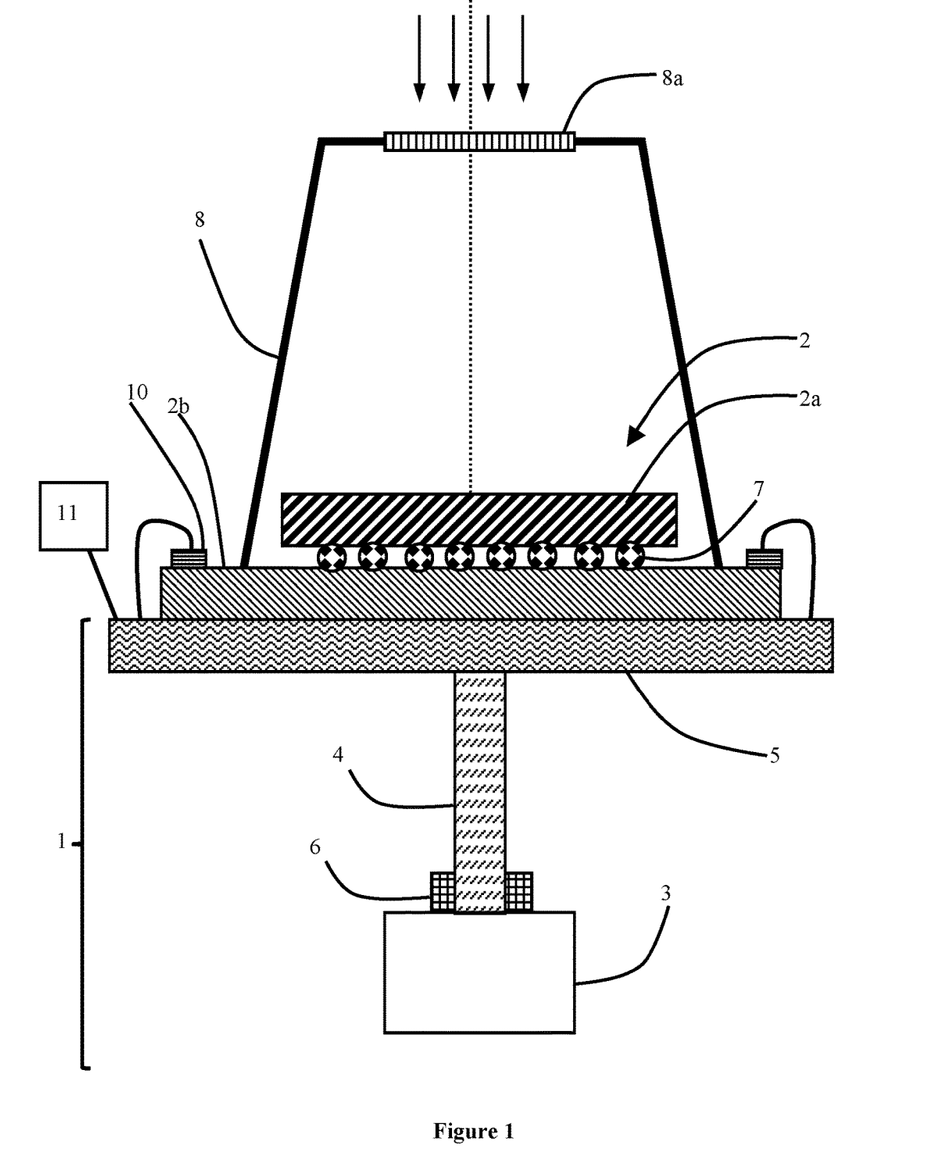
FIG. 1 represents a cryostat fitted in a detection device comprising a detector coupled with a cooling system, in schematic manner in cross-section.

FIG. 1 schematically represents a cooling device 1 and more precisely a cooling device 1 connected to a detector 2 to form a cooled detection device.

The cooling device 1 comprises a cooling system 3 and a cold finger 4 terminated by a cooling plate 5. The element to be cooled is placed on the cooling plate 5 and is in contact with the cooling plate 5 so as to be cooled by means of the cooling system 3 and more precisely by means of a cooling fluid flowing inside the cold finger 4.

The cooling device comprises a cold finger 4 which makes the mechanical connection and performs the thermal insulation between the cooling plate 5 and cooling system 3. In the illustrated example, the element to be cooled is a detector.

The cold finger 4 mechanically connects the cooling system 3 with the cooling plate 5. The cooling system 3 operates by means of a cooling fluid located inside the cold finger 4. The cooling fluid is at low temperature so as to cool the detector 2. In advantageous manner, the cooling system 3 is configured so that the temperature of the cooling fluid is less than −20° C., preferably less than 220K and in even more preferential manner less than 150K.

In general manner, the cooling system 3 uses a fluid under pressure which is confined and flows inside the cold finger 4. The cooling fluid performs the heat transfer between the cooling plate 5 and cooling system 3. The cold finger 4 enables the cooling fluid to be channeled between the cooling plate 5 and cooling system 3.

The cold finger 4 is a hollow part of elongate shape. Preferentially, the cold finger 4 is of cylindrical shape and revolution. One end of the finger 4 is in thermal contact with the cooling plate 5 and the other end is in mechanical contact with the cooling system 3 which is at a higher temperature. The cold finger 4 also has an interface with the cooling system 3, for example a cryogenerator.

A temperature gradient exists along the cold finger 4. In an alternative embodiment, the end of the cold finger 4 forms the cooling plate 5. The cold finger 4 and cooling plate 5 are advantageously made from the same material which facilitates the mechanical strength of these two elements over a large temperature range. The end of the cold finger 4 in contact with the element to be cooled provides the cooling power created by expansion of the cooling fluid.

As indicated in the foregoing, the plate 5 is mechanically connected to its cooling system 3 which enables heat transfers detrimental to efficient cooling of the element present on the cooling plate 5. To ensure efficient cooling, the cold finger 4 is thermally insulating between its two opposite ends so as to minimize the thermal leaks which exist between the cooling plate 5 and its cooling system 3.

The base of the cold finger 4 preferentially forms the mechanical interface and ensures the tightness between the cold finger 1 and cooling system 3.

The cooling system 3 can be a known expansion engine (commonly called Joule-Thomson machine) or a known cyclic machine, for example a machine using the Stirling cycle. The cooling system 3 can comprise a pressure oscillator which generates a pressure wave in a fluid and the fluid is successively compressed and expanded.

The cooling system 3 comprises an electromechanical oscillator which generates a pressure wave in an active chamber containing a fluid. The fluid is advantageously a gas. The chamber comprises a part equipped with a mobile regenerator or mover which uses the expansion and compression cycles of the fluid to perform a Stirling cycle.

The chamber is formed by the inside of the cold finger 4 and the expansion enables one end of the cold finger 4 (the top of the cold finger in the figures) and also the cooling plate to be cooled. The cold finger 4 comprises at least one side wall defining a confinement channel of the cooling fluid coming from the cooling system 3. Depending on the embodiments, the pressure in the cold finger 4 may be higher, for example between 2 bar and 10 bar, possibly up to 30 bar or more.

To improve the performances of the cooling device 1, it is advantageous to limit heat transfers between the cooling system 3 and cooling plate 5. It is particularly advantageous to place a thermal insulator between the two opposite ends of the cold finger 4.

This precaution makes it easier to maintain the thermal insulation between the top part of the cold finger 4, for example at cryogenic temperature, and the bottom part of the cold finger which is at a higher temperature, for example ambient temperature.

The cold finger 4 comprises at least one side wall which forms the sides of the finger. The sides of the cold finger 4 can be broken down into a side wall or into several side walls. The cold finger 4 is terminated by the cooling plate which closes off the cold finger 4.

The side walls of the cold finger 4 comprise at least a part formed by an at least partially amorphous metal alloy, i.e. a non-crystalline metallic material which presents a disordered atomic structure. What is meant by at least partially amorphous metallic alloy is a material comprising at least 50% by volume of amorphous material, the rest of the material being in polycrystalline state. It is advantageous for the material to contain at least 50% by volume of amorphous phase as this enables a less fragile material to be produced. In particularly advantageous manner, the material comprises at least 90% by volume of amorphous phase so as to have a material with optimal mechanical and thermal performances. This particular choice enables a distinct improvement of performances to be obtained in comparison with cold fingers made from polycrystalline metal alloys of the prior art. Improvement of the insulating nature of the cold finger is obtained by using a material which presents a lower thermal conductivity than the TA6V alloy used in the prior art.

What is meant by thermal conductivity or thermal conductibility is the physical quantity characterizing the behaviour of materials when heat transfer by conduction takes place. By a misuse of language, the term thermal resistivity is sometimes used to characterize the physical quantity translating the behaviour of materials opposing heat transfer by conduction. However, this formulation should be dissociated from the notion of thermal resistance commonly used by metallurgists working in the field of amorphous metal alloys and expressing the temperature difference that exists between ambient temperature and the efficient transition temperature. This temperature difference corresponds to the temperature range within which the amorphous metal alloy can be used. A resistant amorphous metal alloy is therefore an alloy having a high efficient transition temperature.

Accordingly, the least one side wall is at least partially formed by an area made from an amorphous metal alloy. In particularly advantageous manner, the amorphous metal alloy is a hafnium-based alloy. The amorphous metal alloy forms the thermal insulator which prevents or slows down heat transfer from the end of the cold finger 4 connected to the cooling system 3 to the end connected to the cooling plate 5.

The inventors discovered that a hafnium-based amorphous metal alloy is particularly advantageous to form at least a part of a cold finger. This does in fact make it possible to considerably reduce the thermal conductivity in comparison with the crystalline alloys normally used to form the cold fingers. These alloys also enable the thermal conductivity to be considerably reduced compared with other metal alloys obtained in amorphous form.

Hafnium-based metal alloys are particularly advantageous as they can be obtained in amorphous form in "bulk" state. Other alloys can in fact be obtained in amorphous state but in the form of a powder or a ribbon which makes it particularly difficult or even impossible to achieve a cold finger. For example purposes, the document U.S. Pat. No. 5,032,196 describes several metal alloys in amorphous state which are produced in the form of powder and/or of ribbons.

What is meant by hafnium-based alloy is an alloy comprising at least 17.5% in atomic % of hafnium. The alloy can contain zirconium in addition to hafnium. It is particularly advantageous for the alloy to contain at least 2% in atomic % of zirconium in order to limit the volumetric mass density of the alloy. The total zirconium and hafnium content is lower than or equal to 70% in atomic %.

The hafnium-based alloy is an at least ternary alloy in order to facilitate the formation of a stable amorphous alloy. The ternary alloy advantageously comprises hafnium and at least two elements chosen from zirconium, copper, titanium and aluminium.

It is advantageous for the alloy to contain copper and/or nickel in order to make it easier to obtain an alloy in amorphous state.

In advantageous manner, the hafnium-based alloy is at least a quaternary alloy so as to increase the thermal stability in comparison with a ternary alloy thereby making it easier to produce an amorphous metal alloy in bulk state. The quaternary alloy advantageously comprises hafnium, zirconium, copper and/or nickel and/or an element chosen from titanium and aluminium.

The alloy can be a quaternary, quinary or senary or higher-degree alloy. The constituents of the alloy are chosen from the elements already set out above. It is however possible to use other elements.

In the case of a ternary alloy, it may be advantageous to use an alloy chosen from: $Hf_{62}Ni_{25}Al_{13}$, $Hf_{60}Ni_{25}Al_{15}$, $Hf_{58}Ni_{25}Al_{17}$, $Hf_{55}Ni_{25}Al_{20}$, $Hf_{53}Ni_{25}Al_{22}$ and $Hf_{50}Ni_{25}Al_{25}$.

In the case of a quaternary alloy, it may be advantageous to use an alloy chosen from: $Hf_{51}Cu_{27.75}Ni_{9.25}Al_{12}$, $Hf_{48}Cu_{29.25}Ni_{9.75}Al_{13}$ and $Hf_{47}Cu_{29.25}Ni_{9.75}Al_{14}$.

In the case of a quinary alloy, it may be advantageous to use an alloy chosen from: $Hf_{49}Ta_2Cu_{27.75}Ni_{9.25}Al_{12}$, $Hf_{46}Nb_2Cu_{29.25}Ni_{9.75}Al_{13}$, $Hf_{45.5}Cu_{27.8}Ni_{9.3}Ti_5Al_{12.4}$ and $Hf_{44.5}Cu_{27}Ni_{13.5}Al_{10}Ti_5$.

What is meant by at least ternary alloy is that the at least three elements constituting the alloy represent 95% of the atoms of the alloy. The rest of the alloy can be formed by impurities and the impact on performances of the alloy will be small. However, the other elements forming the alloy each have a content of less than 1% in atomic %.

It is also advantageous that when copper is used, the copper content of the alloy is less than 40% in atomic %, as otherwise this gives rise to difficulties of connection between the cold finger and the cooling device. When the alloy contains copper, it is particularly advantageous for the total hafnium content and possibly the zirconium content to be greater than or equal to the copper content and preferably strictly greater than the copper content so as to reduce the difficulties of connection between the cold finger and the cooling device even further.

In advantageous manner, the total content of zirconium and hafnium is greater than or equal to the content of any other element contained in the alloy.

A hafnium-based alloy as described in the foregoing and in amorphous state presents a thermal conductivity which is lower than 4.5 W/m/° C. at 20° C. which represents a gain of at least 20% compared with a TA6V alloy which is usually used. This gain enables the cold finger area to be considered as a thermal insulator.

In even more advantageous manner, the metal alloy contains at least 20% in atomic % of hafnium and preferably between 20% and 30% in atomic % to form an alloy having a thermal conductibility equal or substantially equal to 4.2 W/m/K at 20° C.

Preferentially, the metal alloy contains at least 30% in atomic % of hafnium and preferably between 30% and 40% in atomic % to form an alloy having a thermal conductibility equal or substantially equal to 4 W/m/K at 20° C.

In a particularly advantageous embodiment, the metal alloy contains at least 40% in atomic % and even more advantageously at least 45% in atomic % of hafnium and preferably at least 50% in atomic % of hafnium which enables an alloy to be formed having a thermal conductibility of less than 3.95 W/m/K at 20° C.

For example, substituting zirconium atoms by hafnium atoms enables the thermal conductivity value of the alloy in amorphous state to be reduced.

The thermal conductibility of the $Hf_{17.5}Zr_{35}Cu_{17.9}Ni_{14.6}Al_{10}Ti_5$ alloy is lower than that of the $Zr_{52.5}Cu_{17.9}Ni_{14.6}Al_{10}Ti_5$ alloy by at least 5%. The thermal conductibility of the $Hf_{26.25}Zr_{26.25}Cu_{17.9}Ni_{14.6}Al_{10}Ti_5$ alloy is lower than that of the $Zr_{52.5}Cu_{17.9}Ni_{14.6}Al_{10}Ti_5$ alloy by at least 8%. The thermal conductibility of the $Hf_{35}Zr_{17.5}Cu_{17.9}Ni_{14.6}Al_{10}Ti_5$ alloy is lower than that of the $Zr_{52.5}Cu_{17.9}Ni_{14.6}Al_{10}Ti_5$ alloy by at least 13%. The thermal conductibility of the $Hf_{52.5}Cu_{17.9}Ni_{14.6}Al_{10}Ti_5$ alloy is lower than that of the $Zr_{52.5}Cu_{17.9}Ni_{14.6}Al_{10}Ti_5$ alloy by at least 16%.

Several documents describe how to obtain metal alloys in amorphous state and more particularly metal alloys which contain for example hafnium, copper, nickel, titanium and aluminium. The documents U.S. Pat. No. 8,163,109 and U.S. Pat. No. 7,645,350 describe amorphous alloys to form projectiles. These documents describe alloys presenting a volumetric mass density of more than 7 g/cm$^3$ and more particularly more than 10.5 g/cm$^3$. This high mass density appears detrimental for formation of an efficient cold finger of a cooling device in comparison with the mass density of the TA6V alloy which is equal to 4.4 g/cm$^3$. These mass density values are all the more unfavourable as the Young's modulus of the alloys presented is substantially identical to that of the TA6V alloy.

The inventors however discovered that, in spite of the large increase of the mass density with this type of alloy, the configuration of the cold finger which is a hollow and static part only results in a slight impairment of the performances of the cooling device and in particular of the optic performances of an optic detector placed on the cooling plate. In other words, quite unexpectedly, the inventors discovered that an increase of the mass density does not result in a marked impairment of the vibration performances of the cold finger related in particular to the vibrations of the cooling system.

The inventors also discovered that hafnium-based alloys are chemically and mechanically stable which enables the compositions of the above examples to be slightly modified without the thermal properties being changed. For this reason, the hafnium content can be slightly changed without this greatly modifying the thermal conductibility values. For example, the hafnium atoms can be replaced by zirconium atoms up to 2% in atomic % without this drastically modifying the thermal performances.

It is also possible to use other compositions, for example:

$((Hf_xZr_{1-x})_{52.5}Cu_{17.9}Ni_{14.6}Al_{10}Ti_5)_{100-y}M_y$ with x varying between 0.1 and 1, y varying between 0 and 3 and M chosen from Nb, Co, Ag, B, Si, C, Sn, Y Cr, Mn, Fe, Ga, Ge, Mo, Ta and W, as these elements enable at least 90% by volume of amorphous phase to be obtained. To obtain an area having at least 90% by volume of amorphous phase, it is advantageous to choose an element from Nb, Y, Co, Fe, Ag, Si, Ge, Ge and Sn.

$(Hf_xZr_{1-x})_{57}Cu_{20}Ni_8Al_{10}Ti_5$ with x varying between 0.1 and 1, $(Hf_{55-x}Cu_{30}Ni_{15})_{100-y}Ti_xAl_y$ with x equal to 0 or 5 and y equal to 0 or 10.

In a particular embodiment, the cooling device 1 is a cryostat, for example with a Dewar flask which contains the element to be cooled. A vacuum is generally created inside the cryostat to limit heat inputs. The cryostat comprises a pump so as to achieve the required vacuum level. The cryostat defines an access channel to the area to be cooled for the cold finger 4 to be able to move out of the area which is in a vacuum.

The fluid used by the cooling system 3 of Stirling type is generally helium or nitrogen, under a mean pressure of several tens of bars. The oscillator can be rotary or linear. It is also possible to use a Joule-Thomson cooling system 3.

To achieve a good resistance of the cooling device 1 with time, it is preferable for the cold finger 4 to be impermeable to the fluid used by the cooling system 3 to avoid increasing the consumption of the cooling device in redhibitory manner and/or impairing the vacuum level inside the cryostat.

The top of the cold finger also called cooling plate 5 is designed to thermally connect the element to be cooled and the rest of the cold finger 1. In advantageous manner, the top is made from crystalline material, advantageously from crystalline metal, in order to obtain an efficient thermal connection with the element to be cooled. The top part of the side wall is on the other hand formed from amorphous metal to reduce the thermal conductibility as soon as connection is made with the element to be cooled or with an intermediate element. The cooling plate 5 can be made from a material added onto the side walls or it can form a single part with the side wall.

Figure 4:
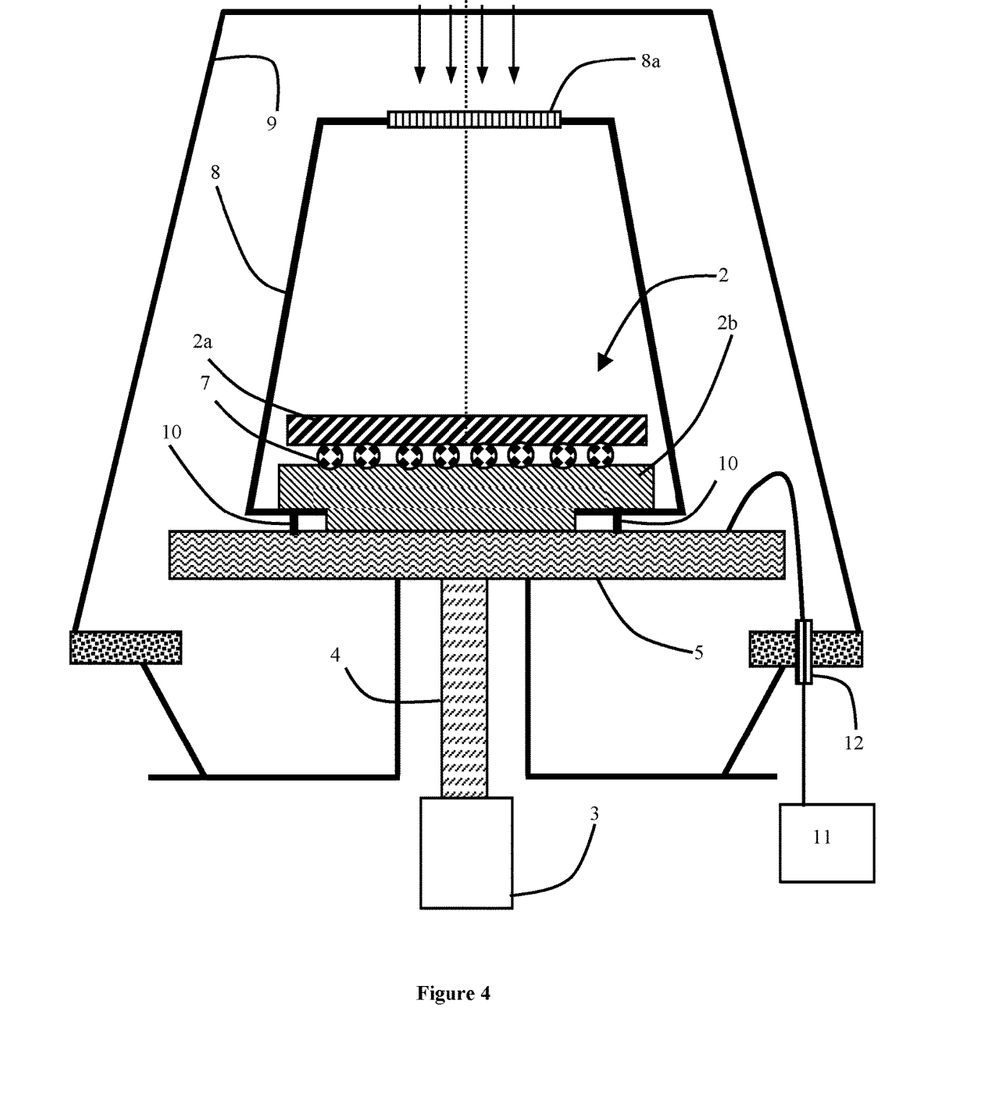
FIG. 4 represents an alternative embodiment of a detection device equipped with a cryostat, in schematic manner in cross-section.

In the embodiments illustrated in FIGS. 1 and 4, this configuration makes it possible to have a top part presenting a good thermal conduction with the cooling plate 5 and a thermally insulating bottom part.

Figure 2:
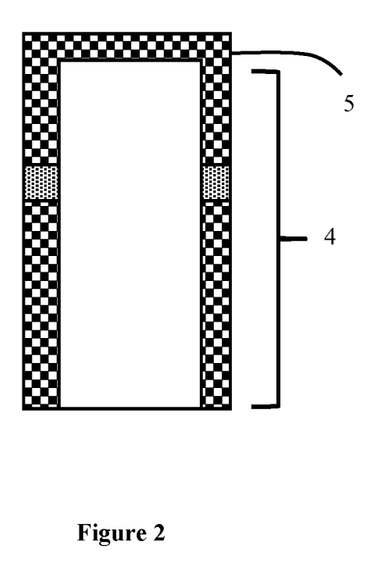
FIGS. 2 and 3 represent two embodiments of a cold finger, in schematic manner in cross-section.

As illustrated in FIG. 2, in advantageous manner, the area made from amorphous metal or amorphous metal alloy forms a ring so as to prevent the formation of a heat loss channel between the element to be cooled and a hot area. The amorphous material ring separates the cooling system 3 and cooling plate 5 completely. In a particularly advantageous embodiment illustrated in FIG. 3, the side wall is completely made from amorphous alloy which enables the thermal insulating nature of the cold finger 4 to be increased.

Figure 3:
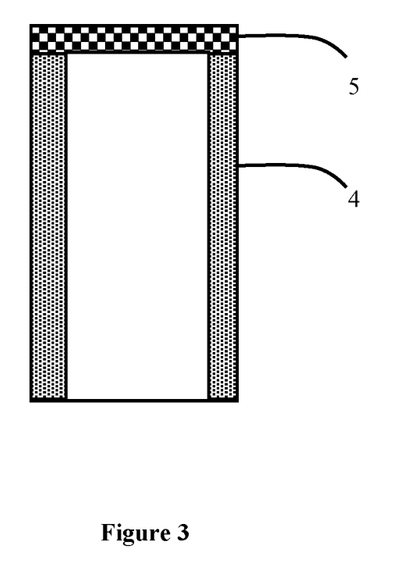

In advantageous manner, the cold finger 4 also comprises a base 6 which preferentially facilitates fixing to the cooling system 3. The base 6 can be made from an amorphous material that is identical to or different from that used for the side walls. However, it is possible to use a crystalline material to form the base 6. The material forming the base 6 is advantageously a material compatible with the assemblies to be implemented, for example to enable laser welding, brazing or electric soldering.

Fixing to the cooling system 3 can be performed in different manners, for example by screw-fastening, the tightness being provided by specific seals.

For example purposes, the side walls of a cold finger have a height comprised between 20 and 40 mm and have an external diameter equal to 6 mm and a thickness comprised between 0.08 and 0.12 mm. The minimum height of cold finger is at least equal to 10 mm.

The use of an amorphous metal enables heat losses to be reduced in comparison with the same metal presented in its monocrystalline or polycrystalline form. In this way, a cold finger 4 at least partially formed by amorphous metal enables a reduced thermal conductivity to be had in comparison with a cold finger 4 made from a monocrystalline or polycrystalline material of identical or similar composition. The reduction of the heat losses is at least equal to 30% compared with a cold finger 4 according to the prior art.

The amorphous structure of the material enables the energy transportation by the phonons and electrons to be reduced which has the effect of increasing the thermal resistance of the cold finger 4. The part made from amorphous material enables the cold finger to be transformed into a thermal insulator.

The use of a material with enhanced thermal performances makes it possible for example to keep a side wall thickness configured to ensure a good tightness of the cold finger, for example a good sealing of the vacuum in a cryostat.

In comparison with a cold finger 4 made from titanium alloy of Ta6V type, the hafnium-based alloy in the form of an amorphous metal alloy provides a better thermal insulation between the hot end and cold end while at the same time keeping good mechanical properties. The inventors observed that the hafnium-based alloy as amorphous metal alloy also presents better performances than the other alloys also studied in the form of metallic glasses. The thermal conductibility values are lower at least in bulk state.

Such a cooling device 1 is particularly advantageous to cool an infrared detector 2 operating at a temperature comprised between 50K and 150K.

Depending on the embodiments, the side walls are formed by the same material with amorphous regions and crystalline regions. In advantageous manner, the whole height of the side walls is formed by the amorphous metal which enables a maximum reduction of the heat losses.

In a particular embodiment, several different materials are used to form the cold finger 4.

Reduction of the heat losses by solid conduction through the cold finger 4 enables a cooling device 1 to be designed which presents a reduced consumption of its cooling system 3. It is also possible to design a more compact cooling device 1 as the vertical dimensions of the cold finger 4 can be used in order to keep substantially identical heat losses to those existing for a device according to the prior art.

As cooling devices 1 operate in inert or controlled atmospheres, corrosion risks are limited or even eliminated.

As the cold finger mechanically connects the cooling system to the cooling plate, no particular magnetic characteristic is sought for in this part of the device.

As indicated in the foregoing, the cooling device 1 can be used in a detection device. The detector 2 or detection device cooled by means of the cold finger 1 comprises a detection circuit 2a and a read circuit 2b. The read and detection circuits 2b and 2a are electrically connected so that the read circuit 2b processes the electric information emitted by the detection circuit 2a.

The read circuit 2b is advantageously formed in the first semiconductor substrate and the detection circuit 2a is hybridized on a first main surface of the read circuit 2b, i.e. mechanically and electrically connected on the read circuit 2b by means of metal balls.

The detection circuit 2a comprises at least one photodetector transforming an optic signal into an electric signal. In preferential manner, the detection circuit 2a comprises a plurality of photodetectors. For example purposes, the photodetector is a photodiode, or a quantum well or multiquantum well device. In a preferential embodiment, the photodetector performs detection in the infrared range. For example purposes, the read circuit 2b performs polarization of the detection circuit 2a and transformation of a current signal emitted by the photodetector into a voltage signal.

In a particular embodiment which can be combined with the previous embodiments, the detection circuit 2a is formed on a first semiconductor substrate and the read circuit 2b is formed on a second semiconductor substrate so as to simultaneously obtain good detection characteristics and good electric performances of the read circuit 2b. The two substrates are formed from different materials. Advantageously, one of the two substrates or both of the substrates are monocrystalline. For example purposes, the substrate of the detection circuit 2a is made from a material called II-VI material, for example made from a HgCdTe base, and the substrate of the read circuit 2b is a silicon-based substrate. In advantageous manner, the substrates made from II-VI material are cooled in order to provide enhanced detection performances. It is also possible to use a material called III-V material, for example having a base formed by InSb or InGaAs.

To obtain a compact system, the two circuits are advantageously hybridized and they form the hybridized component. Hybridization of the two substrates is advantageously performed by one or more balls 7 made from electrically conducting material which are arranged between the two circuits. The detection circuit 2a is hybridized on a first main surface of the 2b so as to form a monoblock assembly and to facilitate electric connection between these two circuits. The first main circuit of the read circuit 2b is advantageously formed by a layer of electrically insulating material which covers the semiconductor substrate and inside which electrically conducting lines are disposed. The second main surface of the read circuit 2b is for example the back surface of the semiconductor substrate.

A cold shield 8 is affixed to the read circuit 2b or to a cold table. The cold shield 8 is fixed in such a way as to surround the detection circuit 2a present on the first main surface of the read circuit 2b. The cold field 8 can comprise a lens 8a.

The cold shield 8 is mainly made from a material opaque to the radiation to be detected in order to form an opaque area. The cold shield 8 comprises an area transparent to the radiation to be detected, which enables the observation area of the detection circuit 2a to be defined. The optic axis X of the detection circuit 2a passes through the transparent area. The transparent area can be formed by a hole or by an optic device, for example one or more lenses which are used to delineate the observation area of the detection device. In this way, the incident radiation passes through the cold shield 8 before being collected by the detection circuit 2a. In the illustrated embodiment, the cold shield 8 is placed directly on the read circuit, but it is also conceivable to place the cold shield 8 on a cold table separating the read circuit and the cold finger.

In an advantageous embodiment illustrated in FIG. 4, the detection device comprises a cryostat equipped with a Dewar flask 9 which incorporates the detector 2. A vacuum is created in the cryostat to limit the formation of gaseous and conductive convective currents which disturb operation of the detector 2. The cold finger 1 is inserted into the cryostat so as to be thermally coupled to the detector 2.

In this configuration, additional mechanical forces are applied on the cold finger 1. The inner part of the cold finger 1 is subjected to a pressure of several bars whereas the top part is placed in a vacuum, for example at a pressure of about $10^{-5}$ mbar.

In preferential manner, the internal volume of the cryostat is at a sub-atmospheric pressure. In an advantageous embodiment, the detection circuit 2a is placed in a vacuum to reduce the heat exchanges by convection of this part of the device. The outer part of the cryostat can then be in contact with a hot area whereas the cold finger 4 serves the purpose of cooling the detector 2.

In a particularly advantageous embodiment, the read circuit 2b comprises one or more connection pads 10 which are located outside the surface delineated by the cold shield 8. These connection pads 10 enable transmission of electric signals from the read circuit 2b to other circuits of the detection device, for example a processing circuit 11 which is configured to process the image sent by the read circuit 2b and/or which is configured to modify the path of a movable object located on the detection device.

The connection pad 8 is connected to the rest of the read circuit 2b by means of an electrically conducting wire which runs inside the read circuit 2b. In this way, it is possible to have a flat surface ensuring an extensive mechanical connection between the cold shield 8 and the read circuit 2b, a very good opacity to stray radiation and an enhanced impermeability to radiation. This configuration is particularly advantageous in the case where the detection circuit 2a is in a controlled atmosphere or in a vacuum as the dependability of the device is enhanced. The electric connection between the read circuit 2b and processing circuit 11 is made outside the closed space by means of connectors. The connectors exit from the read circuit 2b outside the closed surface defined by the connection with the cold shield.

The detection circuit 2a is designed to be thermally connected to the cold source formed by the cooling system 3 in order to work at reduced temperature. In the particular embodiment illustrated in FIGS. 1 and 4, the device comprises a cold table forming the cooling plate on which the read circuit 2b is fixed. The cold table acts as mechanical support for the hybridized component. In advantageous manner, the cold table is electrically connected to the read circuit 2b and it participates in transit of the electric signals to the processing circuit 11. The second main surface of the read circuit 2b can be fixed directly to the cold table.

In this configuration, there are successively the cold table, the read circuit 2b and detection circuit 2a. The cold table is designed to be thermally connected to the cooling system 3 and the cold is imposed on the read circuit 2b and on the detection circuit 2a by means of the cold table. In other words, the cold table is designed to perform the thermal connection between the detection circuit 2a and cooling system 3.

When a cryostat is used, an additional electric connection 12 passes through the cryostat to connect the detector to the processing circuit 11.

As an alternative, the cooling plate 5 is not configured to receive an element to be cooled or the cooling device comprises several cooling plate 5 some of which are not used to cool a detector or another device. The cooling plate 5 enables the impurities present in the cryostat to be fixed in order to trap them. The atmosphere in the cryostat is then cleaner.

In a particular embodiment, the cold finger is connected to the electric ground so as to remove stray charges which could lead to impairment of the read circuit and/or of the detection circuit for example by means of an electrostatic discharge.

The invention claimed is:

1. Cooling device comprising:
   a cooling plate,
   a cooling system provided with a cooling fluid,
   a hollow cold finger closed at one end by the cooling plate, the cooling fluid being located in the cold finger to cool the cooling plate, the cold finger comprising at least one side wall defining a confinement channel of the cooling fluid from the cooling system,
   wherein:
   said at least one side wall is at least partially formed by an area made from an at least partially amorphous metal alloy,
   the area made from the at least partially amorphous metal alloy is formed by an at least ternary alloy containing at least 17.5% in atomic % of hafnium and possibly of copper with a maximum content equal to 40% in atomic % of copper so as to form a thermal insulator.

2. Cooling device according to claim 1, wherein the at least partially amorphous metal alloy contains at least 20% in atomic % of hafnium.

3. Cooling device according to claim 2, wherein the at least partially amorphous metal alloy contains at least 30% in atomic % of hafnium.

4. Cooling device according to claim 3, wherein the at least partially amorphous metal alloy contains at least 40% in atomic % of hafnium.

5. Cooling device according to claim 4, wherein the at least partially amorphous metal alloy contains at least 50% in atomic % of hafnium.

6. Cooling device according to claim 1, wherein the at least partially amorphous metal alloy contains zirconium and wherein the total content of hafnium and zirconium is less than or equal to 70% in atomic %.

7. Cooling device according to claim 1, wherein the at least partially amorphous metal alloy contains zirconium and wherein the total content of hafnium and zirconium is greater than the content of any other element of the at least partially amorphous metal alloy.

8. Cooling device according to claim 1, wherein the at least partially amorphous metal alloy contains copper and wherein the copper content is less than the total content of hafnium and of zirconium if applicable.

9. Cooling device according to claim 1, wherein the at least partially amorphous metal alloy is chosen from alloys of $Hf_{52.5}Cu_{17.9}Ni_{14.6}Al_{10}Ti_5$, $Hf_{35}Zr_{17.5}Cu_{17.9}Ni_{14.6}Al_{10}Ti_5$, $Hf_{17.5}Zr_{35}Cu_{17.9}Ni_{14.6}Al_{10}Ti_5$ and $Hf_{26.25}Zr_{26.25}Cu_{17.9}Ni_{14.6}Al_{10}Ti_5$.

10. Cooling device according to claim 1, wherein the at least partially amorphous metal alloy is chosen from alloys of $((Hf_xZr_{1-x})_{52.5}Cu_{17.9}Ni_{14.6}Al_{10}Ti_5)_{100-y}M_y$ with x varying between 0.1 and 1, y varying between 0 and 3 and M chosen from Nb, Co, Ag, B, Si, C, Sn, Y Cr, Mn, Fe, Ga, Ge, Mo, Ta and W, $(Hf_xZr_{1-x})_{57}Cu_{20}Ni_8Al_{10}Ti_5$ with x varying between 0.1 and 1 and $(Hf_{55-x}Cu_{30}Ni_{15})_{100-y}Ti_xAl_y$ with x equal to 0 or 5 and y equal to 0 or 10.

11. Cooling device according to claim 1, wherein the at least partially amorphous metal alloy is chosen from $Hf_{62}Ni_{25}Al_{13}$, $Hf_{60}Ni_{25}Al_{15}$, $Hf_{58}Ni_{25}Al_{17}$, $Hf_{55}Ni_{25}Al_{20}$, $Hf_{53}Ni_{25}Al_{22}$, $Hf_{50}Ni_{25}Al_{25}$, $Hf_{51}Cu_{27.75}Ni_{9.25}Al_{12}$, $Hf_{48}Cu_{29.25}Ni_{9.75}Al_{13}$, $Hf_{47}Cu_{29.25}Ni_{9.75}Al_{14}$, $Hf_{49}Ta_2Cu_{27.75}Ni_{9.25}Al_{12}$, $Hf_{46}Nb_2Cu_{29.25}Ni_{9.75}Al_{13}$, $Hf_{45.5}Cu_{27.8}Ni_{9.3}Ti_5Al_{12.4}$ and $Hf_{44.5}Cu_{27}Ni_{13.5}Al_{10}Ti_5$.

12. Cooling device according to claim 1, wherein the area made from the at least partially amorphous metal alloy forms a ring completely separating the cooling system and the cooling plate.

13. Cooling device according to claim 1, wherein the at least one side wall is completely formed by the at least partially amorphous metal alloy so as to connect the cooling system and the cooling plate.

14. Cooling device according to claim 1, wherein a photodetector is connected to the cooling plate.

15. Cooling device according to claim 1, wherein the cold finger is in an inert atmosphere.

* * * * *